US010957596B2

(12) United States Patent
Leobandung et al.

(10) Patent No.: US 10,957,596 B2
(45) Date of Patent: Mar. 23, 2021

(54) CATERPILLAR TRENCHES FOR EFFICIENT WAFER DICING

(71) Applicant: INTERNATIONAL BUSINESS MACHINES CORPORATION, Armonk, NY (US)

(72) Inventors: Effendi Leobandung, Stormville, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/669,813

(22) Filed: Oct. 31, 2019

(65) Prior Publication Data

US 2020/0066591 A1 Feb. 27, 2020

Related U.S. Application Data

(63) Continuation of application No. 16/110,096, filed on Aug. 23, 2018, now Pat. No. 10,573,558.

(51) Int. Cl.
*H01L 21/78* (2006.01)
*H01L 21/306* (2006.01)
*H01L 21/308* (2006.01)
*H01L 23/544* (2006.01)

(52) U.S. Cl.
CPC ............ *H01L 21/78* (2013.01); *H01L 21/306* (2013.01); *H01L 21/308* (2013.01); *H01L 23/544* (2013.01); *H01L 2223/54426* (2013.01)

(58) Field of Classification Search
CPC ............... H01L 21/78; H01L 21/308; H01L 21/306–30608; H01L 21/3063; H01L 21/30655; H01L 21/3065
See application file for complete search history.

(56) References Cited

U.S. PATENT DOCUMENTS

| 5,904,546 | A  | * | 5/1999  | Wood ................. H01L 21/78 257/E21.599 |
| 7,052,975 | B2 | * | 5/2006  | Koizumi .............. H01L 21/78 257/E21.599 |
| 8,072,044 | B2 |   | 12/2011 | Gruenhagen et al. |
| 8,222,120 | B2 |   | 7/2012  | Chun et al. |
| 9,287,175 | B2 |   | 3/2016  | Hua et al. |
| 9,472,458 | B2 | * | 10/2016 | Doub .................. H01L 21/3065 |

(Continued)

OTHER PUBLICATIONS

List of IBM Patents or Patent Applications Treated as Related dated Oct. 31, 2019, 2 pages.

*Primary Examiner* — Errol V Fernandes
*Assistant Examiner* — Jeremy J Joy
(74) *Attorney, Agent, or Firm* — Tutunjian & Bitetto, P.C.; L. Jeffrey Kelly

(57) ABSTRACT

A method for fabricating caterpillar trenches for wafer dicing includes forming at least one opening within a mask formed on a substrate to protect an electronics device disposed on the substrate during isotropic etching, and isotropically etching through the at least one opening to form at least one wafer dicing channel, including laterally etching a collection of nested trenches including trenches each having a non-circular cross-section from a first surface of the substrate to a second surface of the substrate opposite the first surface.

19 Claims, 11 Drawing Sheets

(56) References Cited

U.S. PATENT DOCUMENTS

| | | | |
|---|---|---|---|
| 2004/0119197 A1* | 6/2004 | Gorczyca | B29C 33/40 |
| | | | 264/219 |
| 2007/0087524 A1* | 4/2007 | Montgomery | H01L 21/78 |
| | | | 438/427 |
| 2007/0249178 A1* | 10/2007 | Ogihara | H01L 21/6836 |
| | | | 438/753 |
| 2010/0120227 A1* | 5/2010 | Grivna | H01L 21/78 |
| | | | 438/462 |
| 2010/0120230 A1* | 5/2010 | Grivna | H01L 21/78 |
| | | | 438/464 |
| 2011/0256690 A1 | 10/2011 | Huang | |
| 2015/0011073 A1 | 1/2015 | Lei et al. | |
| 2015/0200119 A1* | 7/2015 | Eaton | H01L 21/67069 |
| | | | 156/345.32 |
| 2016/0056080 A1* | 2/2016 | Takahashi | H01L 21/6836 |
| | | | 438/462 |
| 2016/0071767 A1* | 3/2016 | Hashimoto | H01L 33/0095 |
| | | | 257/620 |
| 2016/0322306 A1 | 11/2016 | Roesner et al. | |
| 2019/0019687 A1* | 1/2019 | Rouviere | H01L 21/308 |

* cited by examiner

CATERPILLAR TRENCHES FOR EFFICIENT WAFER DICING

BACKGROUND

The present invention generally relates to semiconductor devices, and more particularly to caterpillar trenches for efficient wafer dicing and methods of fabricating the same.

During integrated circuit manufacturing, wafer dicing is a process by which dies are separated from a wafer following wafer processing. A variety of techniques can be used to perform wafer dicing, including but not limited to sawing (e.g., using a dicing saw machine) and laser cutting. Wafer dicing processes are generally automated processes to maintain accuracy and precision. Following the wafer dicing process, individual chips can be used to build devices, such as, e.g., computers.

SUMMARY

In accordance an embodiment of the present invention, a method for fabricating caterpillar trenches for wafer dicing is provided. The method includes forming at least one opening from a top surface of a mask formed on a substrate to a bottom surface of the mask opposite the top surface of the mask. The mask is formed on the substrate to protect an electronics device disposed on the substrate during isotropic etching. The method further includes isotropically etching through the at least one opening to form at least one wafer dicing channel, including isotropically etching a collection of nested trenches from a top surface of the substrate to a bottom surface of the substrate opposite the top surface of the substrate.

In accordance another embodiment of the present invention, a method for fabricating caterpillar trenches for wafer dicing is provided. The method includes forming a mask on a substrate to protect an electronics device disposed on the substrate during isotropic etching, forming at least one opening from a top surface of the mask to a bottom surface of the mask opposite the top surface of the mask, isotropically etching through the at least one opening to form at least one wafer dicing channel, including isotropically etching a collection of nested trenches from a top surface of the substrate to a bottom surface of the substrate opposite the top surface of the substrate.

In accordance with yet another embodiment of the present invention, a method for fabricating caterpillar trenches for wafer dicing is provided. The method includes forming at least one opening within a mask formed on a substrate to protect an electronics device disposed on the substrate during isotropic etching, and isotropically etching through the at least one opening to form at least one wafer dicing channel, including laterally etching a collection of nested trenches including trenches each having a non-circular cross-section from a first surface of the substrate to a second surface of the substrate opposite the first surface In accordance with yet another embodiment of the present invention, a method for fabricating caterpillar trenches for wafer dicing is provided. The method includes forming a mask on a substrate to protect an electronics device disposed on the substrate during isotropic etching, forming at least one opening within the mask, isotropically etching through the at least one opening to form at least one wafer dicing channel, including laterally etching a collection of nested trenches including trenches each having a non-circular cross-section from a first surface of the substrate to a second surface of the substrate opposite the first surface, and removing the mask after the at least one wafer dicing channel is formed.

In accordance with yet another embodiment of the present invention, a semiconductor device including caterpillar trenches for wafer dicing is provided. The device includes a substrate, an electronics device disposed on the substrate, and at least one wafer dicing channel including a collection of nested trenches from a top surface of the substrate to a bottom surface of the substrate opposite the top surface of the substrate.

In accordance with yet another embodiment of the present invention, a semiconductor device including caterpillar trenches for wafer dicing is provided. The device includes a substrate, an electronics device disposed on the substrate, and at least one wafer dicing channel including a collection of nested trenches including trenches each having a non-circular cross-section from a top surface of the substrate to a bottom surface of the substrate opposite the top surface of the substrate.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
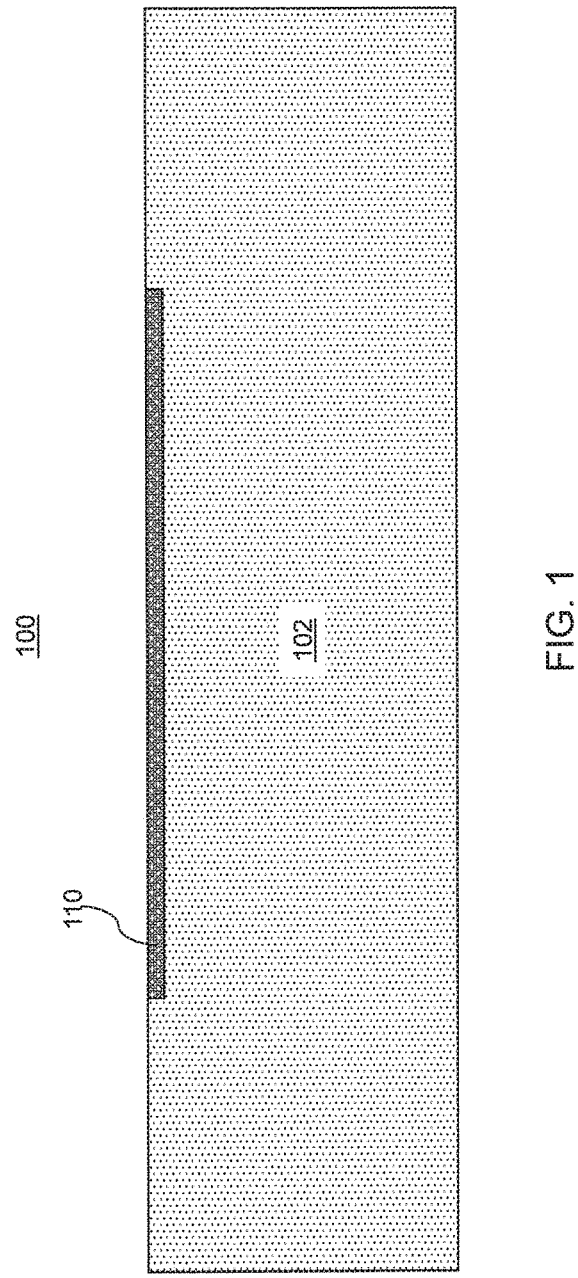
FIG. 1 is a cross-sectional view of a circuit formed in a substrate during the fabrication of a semiconductor device, in accordance with an embodiment of the present invention.

To form optimized and low-cost wafer dicing channels, the embodiments described herein provide for the fabrication of caterpillar trenches for efficient wafer dicing. The embodiments described herein can reduce the amount of space that the wafer dicing channels consume on the wafer. For example, the embodiments described herein can use an isotropic etch process and multiple sidewalls formed from a spacer material, as opposed to an anisotropic etch process such as, e.g., reactive ion-etching (RIE), to form optimized and lower cost dicing channels. The dicing channels formed in accordance with the embodiments described herein can have sub-1 micron (μm) widths, as opposed to conventional dicing channels which can have widths ranging from about 10 μm to 100 μm. Thus, the embodiments described herein can be used to make smaller electronic devices (e.g., computers) with die sizes of, e.g., about 100 μm×100 μm.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of a semiconductor device 100 including a substrate 102 is provided. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As further shown in FIG. 1, an electronics device 110 is disposed on the substrate. In one embodiment, the electronics device 110 includes a circuit. For example, the electronics device 110 can include, e.g., an integrated circuit.

Figure 2:
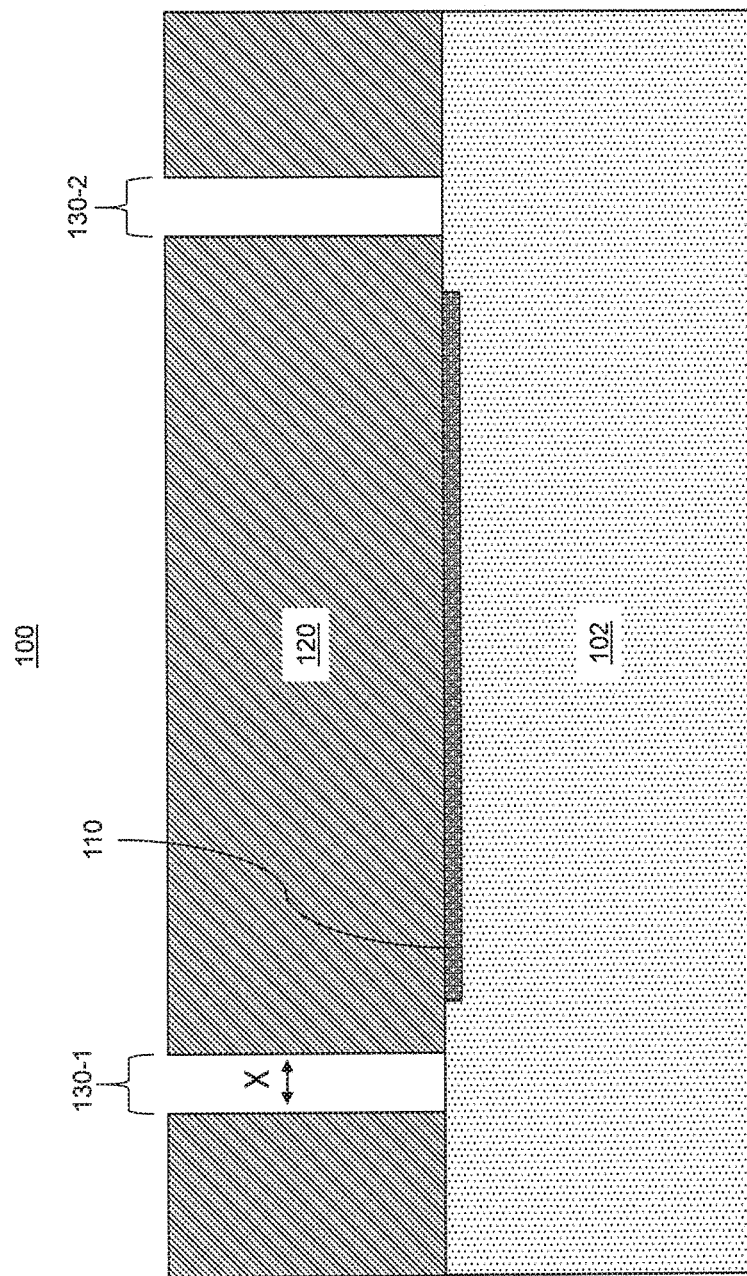
FIG. 2 is a cross-sectional view of the formation of a mask during the fabrication of the semiconductor device, in accordance with an embodiment of the present invention.

Referring to FIG. 2, a mask 120 is formed on the substrate 102 and the electronics device 110. In one embodiment, the mask 120 has a thickness of, e.g., about 1 µm. However, in other embodiments, the mask 120 can be thinner or thicker. The mask 120 can be patterned using any suitable process in accordance with the embodiment described herein (e.g., lithography). The mask 120 can include any suitable dielectric material in accordance with the embodiments described herein, such as, e.g., silicon dioxide ($SiO_2$) or a silicon nitride material (e.g., SiN).

As further shown, etching is performed to create openings 130-1 and 130-2 through the mask 120 and up to the substrate 102. As shown, the openings 130-1 and 130-2 can have a width "X". In one embodiment, the width "X" is below, e.g., about 1 µm. More specifically, the width "X" can be, e.g., about 0.5 µm.

In one embodiment, the openings 130-1 and 130-2 are created using isotropic or non-directional etching. In contrast to anisotropic or directional etch processes, which include etch processes that etch material in a single direction, isotropic etch processes etch material in multiple directions. For example, isotropic etch processes can have the same or similar etch rates for all spatial directions (e.g., lateral and downward etching can take place at the same or similar rate). Isotropic etch processes can include wet isotropic etch processes and dry isotropic etch processes.

In one embodiment, a wet isotropic etch process is used to create the openings 130-1 and 130-2. A wet isotropic etch process is an isotropic etch processes that removes material by using a solvent including one or more liquid chemicals or etchants that react with material subject to removal. For example, the etchants can oxidize the material via a chemical reaction (e.g., a reduction-oxidation (redox) reaction), and the oxidized material can be removed (e.g., dissolved). The etch rate for a wet isotropic etch process can be determined at least in part based on the concentrations of the one or more etchants in the solvent.

Figure 3:
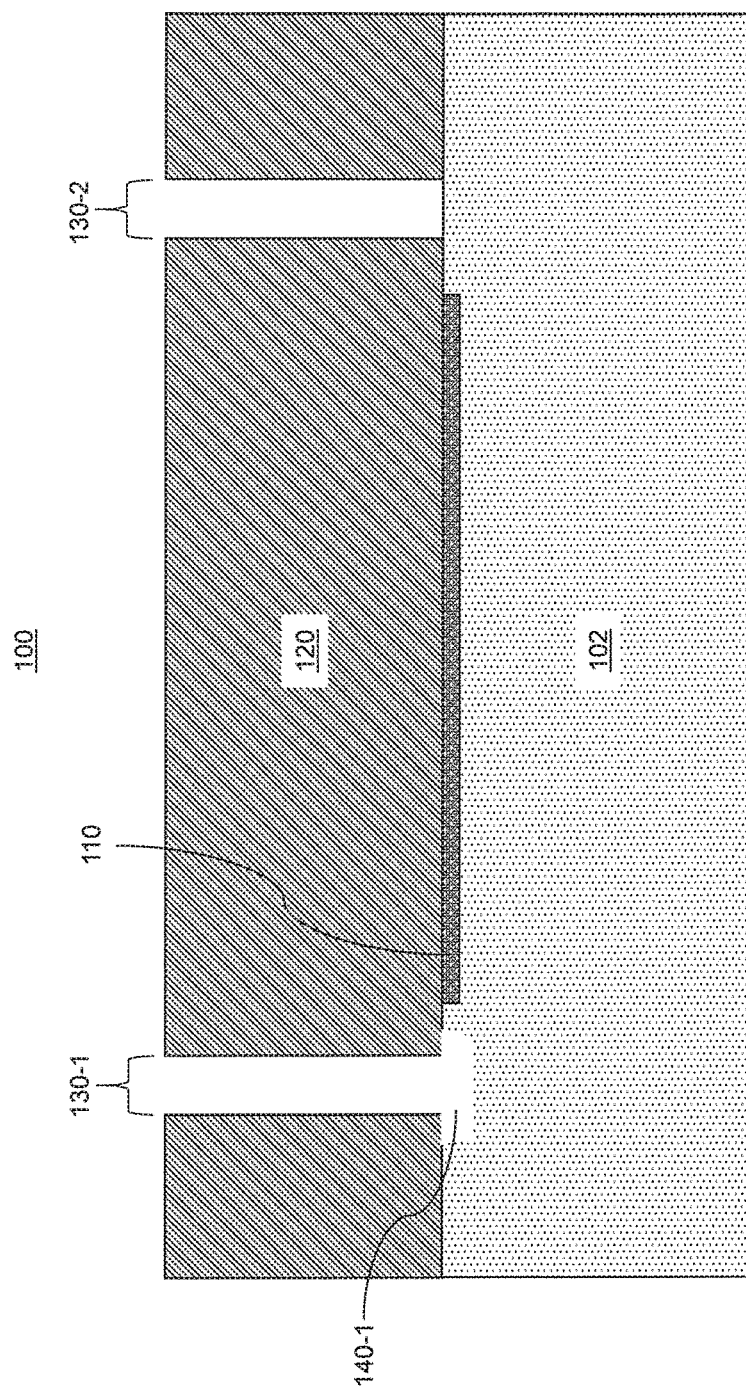
FIG. 3 is a cross-sectional view of the formation of first trenches during the fabrication of the semiconductor device, in accordance with an embodiment of the present invention.

Referring to FIG. 3, a trench 140-1 is formed within the substrate 102 corresponding to the opening 130-1 using isotropic etching (e.g., wet isotropic etching). The lateral etching of the isotropic etch process removes material of the substrate 102 underneath the mask 120 due to the solvent reacting underneath the mask 120, which is referred to as undercutting.

The removal of the material underneath the mask 120 can create a concave shaped void. It is to be understood and appreciated that due to the location of the trenches 140-1 and 140-2 relative to the electronics device 110, the amount of undercutting needs to be controlled to prevent damage to the electronics device 110. The lateral etch can be, e.g., about 30% for a well-tuned process. The trench 140-1 can have a depth of, e.g., about 1 µm.

Figure 4:
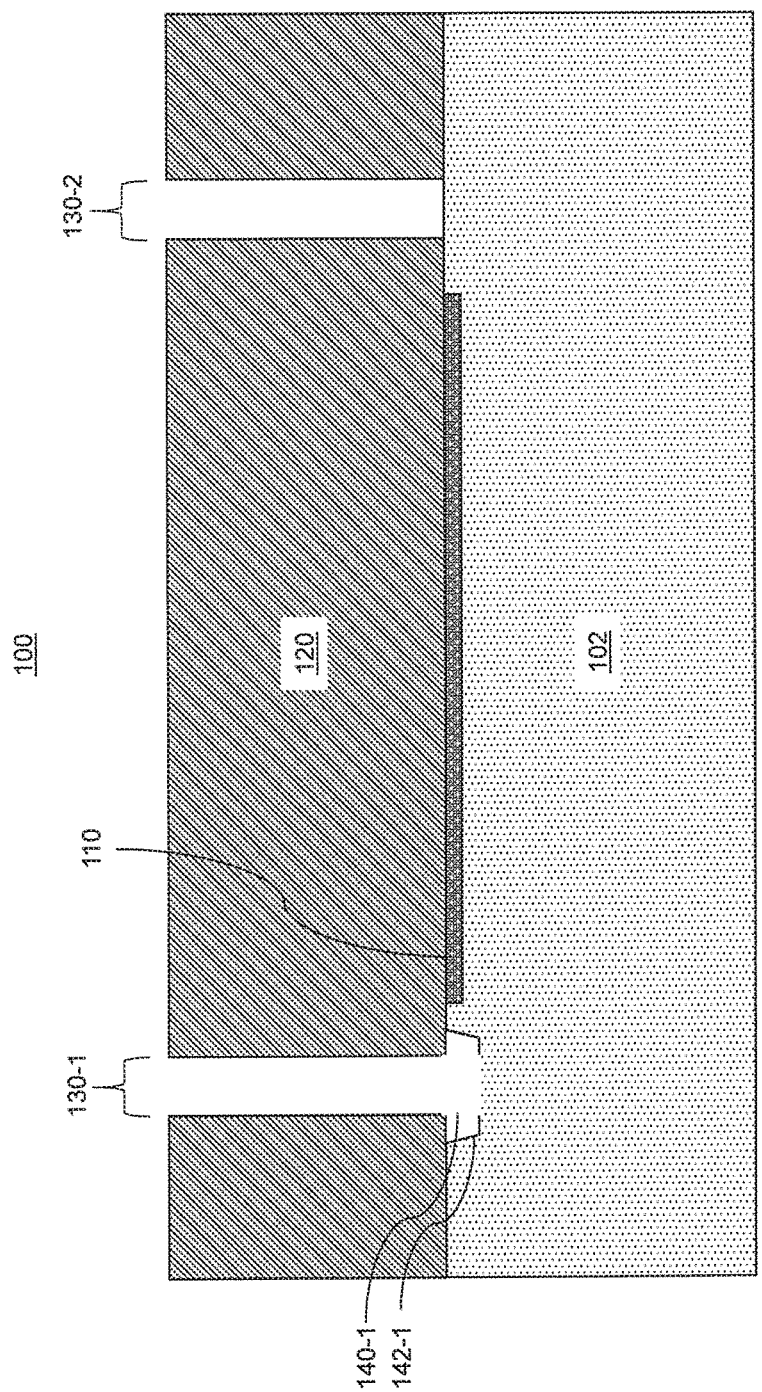
FIG. 4 is a cross-sectional view of the formation of spacer material along sidewalls of the first trenches during the fabrication of the semiconductor device, in accordance with an embodiment of the present invention.

Referring to FIG. 4, a spacer 142-1 is formed within the trench 140-1. The spacer 142-1 can be formed within the trench 140-1 by depositing dielectric material along the substrate 102 within the trench 140-1, and etching the lateral surface of the dielectric material corresponding to the opening 130-1. For example, an anisotropic etch process can be used to etch the lateral surface of the dielectric material corresponding to the opening 130-1. The spacer 142-1 can have a thickness of, e.g., about 1 nm. The spacer 142-1 can be formed using any suitable material and process in accordance with the embodiments described herein. For example, the spacer 142-1 can include, e.g., a hafnium oxide material (e.g., $HfO_2$).

Figure 5:
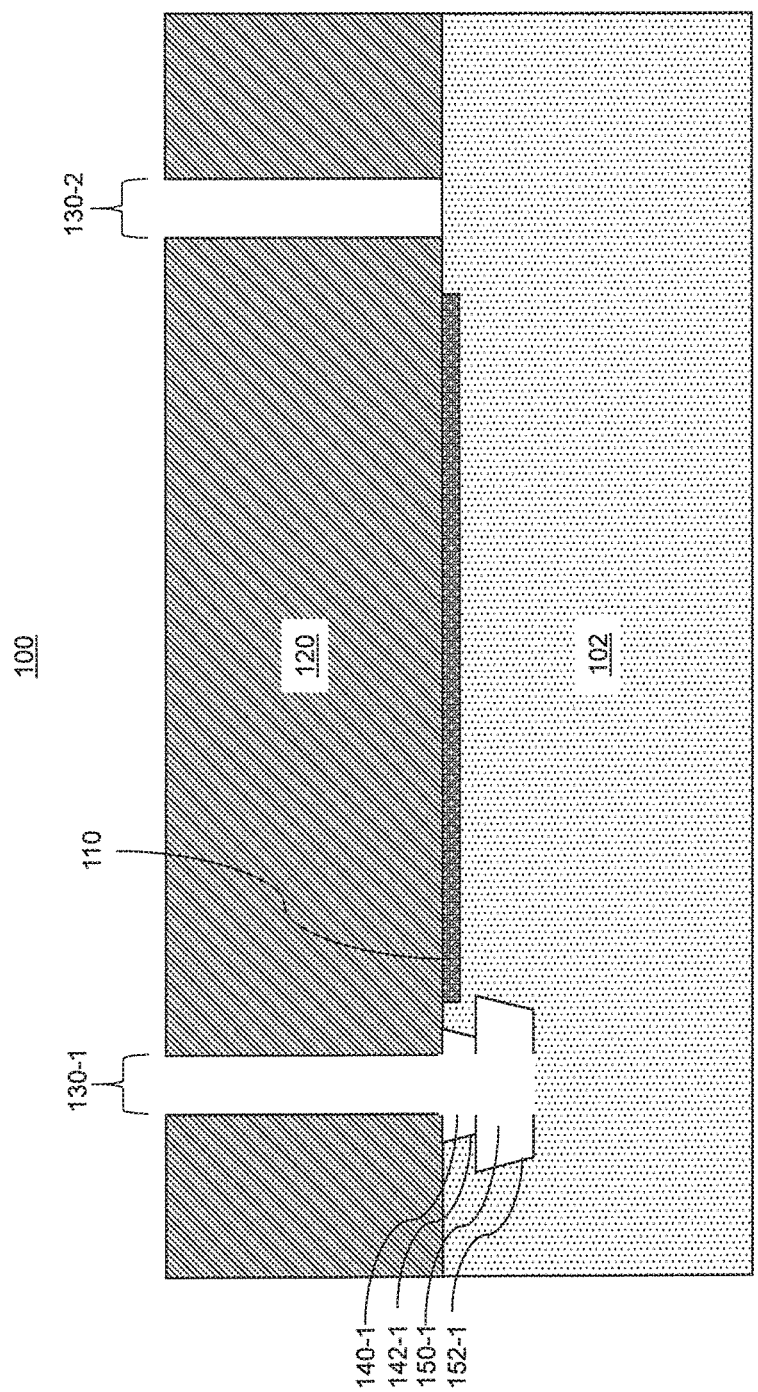
FIG. 5 is a cross-sectional view of the formation of second trenches and spacer material along sidewalls of the second trenches during the fabrication of the semiconductor device, in accordance with an embodiment of the present invention.

Referring to FIG. 5, a trench 150-1 is formed within the substrate 102 underneath the trench 140-1 using isotropic etching (e.g., wet isotropic etching). Undercutting results from the lateral etching of the isotropic etch process removing material of the substrate 102 underneath the trench 140-1. It is to be understood and appreciated that less care is needed to control the undercutting with respect to the electronics device 110, since the trench 150-1 is located below the electronics device 110. The trench 150-1 can have a depth of, e.g., about 2 µm.

As further shown in FIG. 5, a spacer 152-1 is formed within the trench 150-1. The spacer 152-1 can be formed within the trench 150-1 by depositing dielectric material along the substrate 102 within the trench 150-1, and etching the lateral surface of the dielectric material corresponding to the opening 130-1. For example, an anisotropic etch process can be used to etch the lateral surface of the dielectric material corresponding to the opening 130-1. The spacer 152-1 can have a thickness of, e.g., about 1 nm. The spacer 152-1 can be formed using any suitable material in accordance with the embodiments described herein. For example, the spacer 152-1 can include, e.g., a hafnium oxide material (e.g., $HfO_2$).

Figure 6:
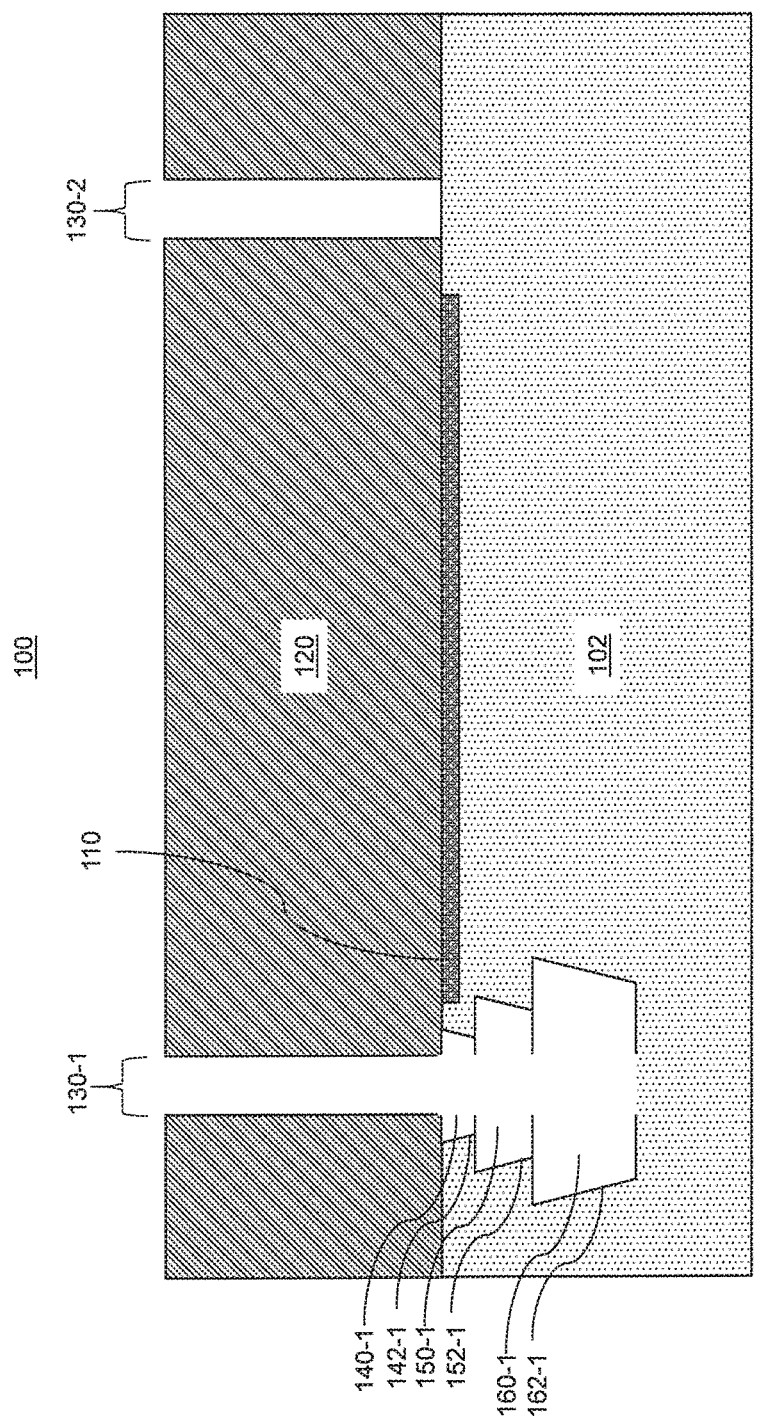
FIG. 6 is a cross-sectional view of the formation of third trenches and spacer material along sidewalls of the third trenches during the fabrication of the semiconductor device, in accordance with an embodiment of the present invention.

Referring to FIG. 6, a trench 160-1 is formed within the substrate 102 underneath the trench 150-1 using isotropic etching (e.g., wet isotropic etching). Undercutting results from the lateral etching of the isotropic etch process removing material of the substrate 102 underneath the trench 150-1. It is to be understood and appreciated that even less care is needed to control the undercutting with respect to the electronics device 110, since the trench 160-1 located even further underneath the electronics device 110. The trench 160-1 can have a depth of, e.g., about 20 µm.

As further shown in FIG. 6, a spacer 162-1 is formed within the trench 160-1. The spacer 162-1 can be formed within the trench 160-1 by depositing dielectric material along the substrate 102 within the trench 160-1, and etching the lateral surface of the dielectric material corresponding to the opening 130-1. For example, an anisotropic etch process can be used to etch the lateral surface of the dielectric material corresponding to the opening 130-1. The spacer 162-1 can have a thickness of, e.g., about 1 nm. The spacer 162-1 can be formed using any suitable material in accordance with the embodiments described herein. For example, the spacer 162-1 can include, e.g., a hafnium oxide material (e.g., $HfO_2$)

Figure 7:
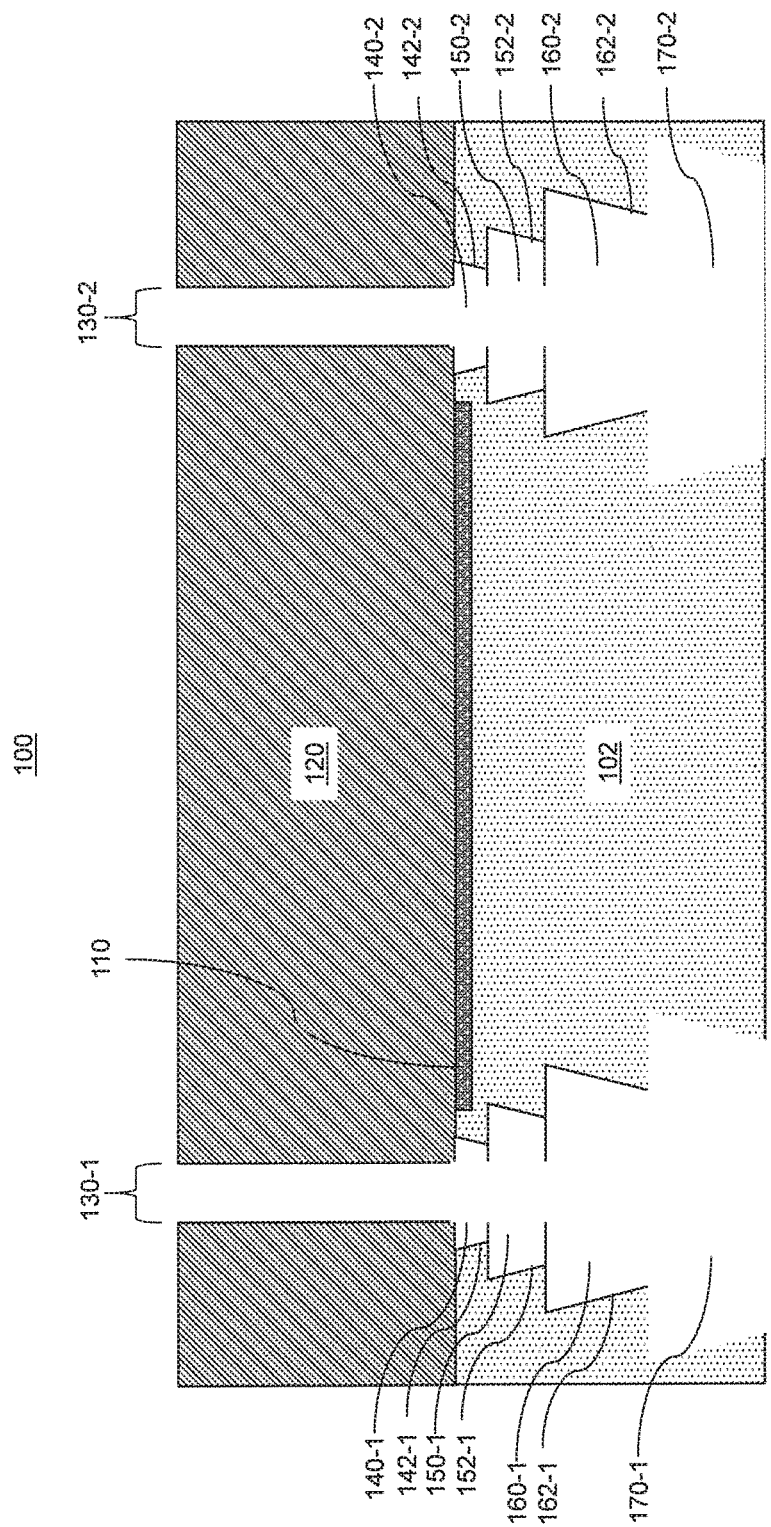
FIG. 7 is a cross-sectional view of the formation of fourth trenches during the fabrication of the semiconductor device, in accordance with an embodiment of the present invention.

Referring to FIG. 7, a trench 170-1 is formed within the substrate 102 underneath the trench 160-1 using isotropic etching (e.g., wet isotropic etching). Undercutting results from the lateral etching of the isotropic etch process removing material of the substrate 102 underneath the trench 160-1. It is to be understood and appreciated that even less care is needed to control the undercutting with respect to the electronics device 110, since the trench 170-1 is located even further underneath the electronics device 110. The trench 170-1 can have a width of, e.g., about 20 μm.

The trench 170-1 in this illustrative embodiment is the trench of the collection of nested trenches corresponding to the bottom surface of the substrate 102. As further shown in FIG. 7, in contrast to the trenches 140-1 through 160-1, the trench 170-1 lacks a spacer. That is, the final trench in the collection of nested trenches can lack a spacer.

As further shown in FIG. 7, another collection of nested trenches 140-2 through 170-2 can be formed through the opening 130-2. The trenches 140-2 through 170-2 can be formed in a manner similar to that described above with respect to trenches 140-1 through 170-1 formed through the opening 130-1. Moreover, the trenches 140-2 through 170-2 can include properties (e.g., thicknesses) similar to those of trenches 140-1 through 170-2, respectively.

Although the opening 130-2 is shown in this illustrative embodiment being formed prior to forming the trench 140-1 through the opening 130-1, the opening 130-2 can be formed at any suitable point within the fabrication process in accordance with the embodiments described herein (e.g., after the formation of the trench 170-1). Additionally, although the trenches 140-2 through 170-2 are shown in this illustrative embodiment being formed after the formation of the trenches 140-1 through 170-1, the trenches 140-2 through 170-2 can be formed at any suitable point within the fabrication process in accordance with the embodiments described herein (e.g., trenches 140-2 through 170-2 can be formed concurrently with respective ones of the trenches 140-1 through 170-1).

The formation of the trenches 140-1 through 170-1 and 140-2 through 170-2 results in the creation of respective dicing channels formed to the bottom surface of the substrate 102. That is, as shown in FIGS. 1-7, each of the wafer dicing channels can include respective collections of nested or stacked trenches.

As shown in FIG. 7 each of the trenches 140-1 through 170-1 and 140-2 through 170-2 can have a trapezoidal shaped cross-section. The trapezoidal shaped cross-section can result from the use of isotropic etching to form each of the trenches 140-1 through 170-1 and 140-2 through 170-2. Although only four trench formation steps were described in this illustrative embodiment to create the respective dicing channels, the trench formation process can include any number of steps to form any number of trenches suitable for creating dicing channels that are formed to the bottom surface of the substrate 102.

As shown in FIG. 7, each of the trenches 140-1 through 170-1 and 140-2 through 170-2 can be arranged in order of ascending widths. For example, as shown in FIG. 7, trench 140-1, which has a top surface corresponding to the top surface of the substrate 102 has a smaller width than the trench 150-1 underneath the trench 140-1, the trench 150-1 has a smaller width than the trench 160-1 located underneath the trench 150-1, and the trench 160-1 has a smaller width than the trench 170-1 having a bottom surface corresponding to the bottom surface of the substrate 102.

Figure 8:
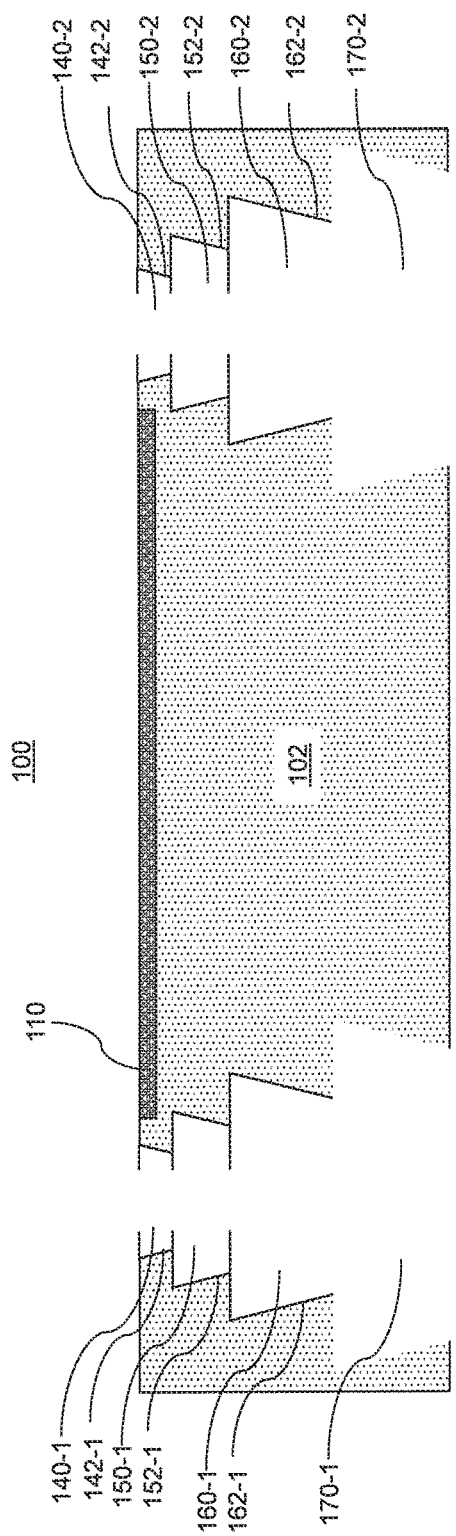
FIG. 8 is a cross-sectional view of the removal of the mask during the fabrication of the semiconductor device, in accordance with an embodiment of the present invention.

Referring to FIG. 8, the mask 120 is removed (e.g., stripped). Any suitable process can be used to remove (e.g., strip) the mask 120 in accordance with the embodiments described herein.

Figure 9:
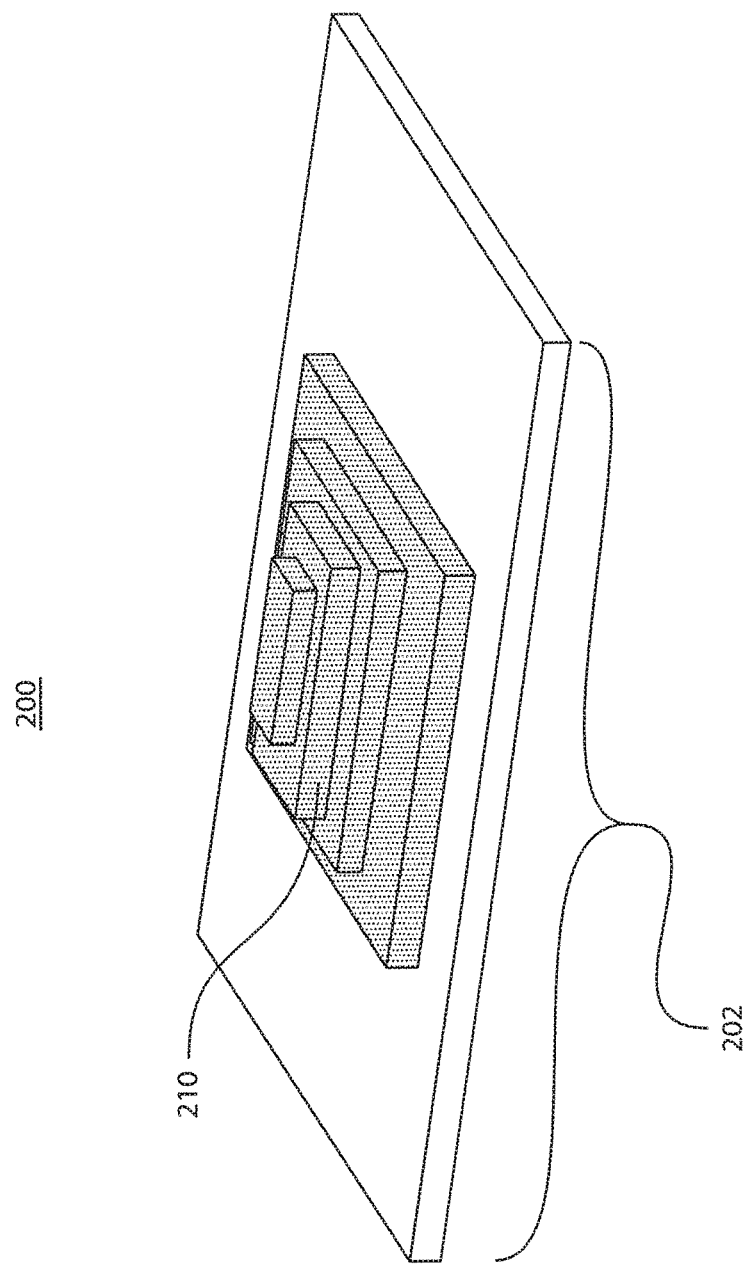
FIG. 9 is a perspective view of the semiconductor device shown in FIG. 8, in accordance with an embodiment of the present invention.

Referring to FIG. 9, a device 200 is shown including a die 210 formed on a substrate 202 after dicing is performed in accordance with the embodiments described herein. As shown, the die 210 has a pyramidal-type shape that can be viewed as a stack of rectangles formed on top of each other in descending size order (e.g., a rectangular pyramidal shape).

Figure 10:
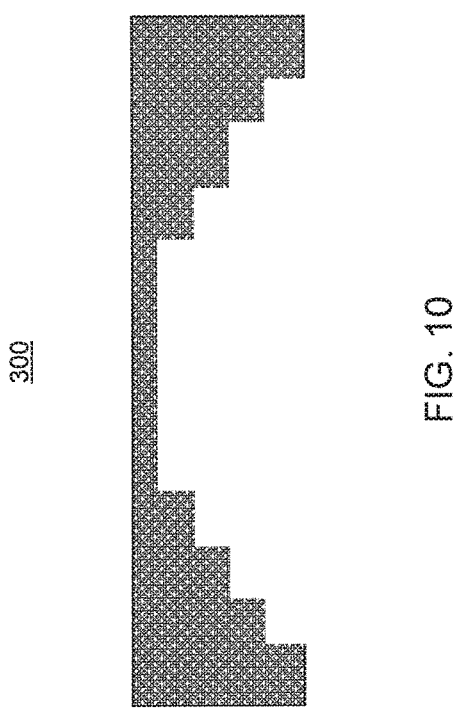
FIG. 10 is a cross-sectional view of a lid for protecting the semiconductor device shown in FIG. 9, in accordance with an embodiment of the present invention.

Referring to FIG. 10, a device 300 is shown. The device 300 can function as a lid for the die, such as the die 210 shown in FIG. 9. The device 300 includes an inner portion having the pyramidal-type shape corresponding to the die to improve contact between the chip and the lid for thermal cooling, if needed.

Figure 11:
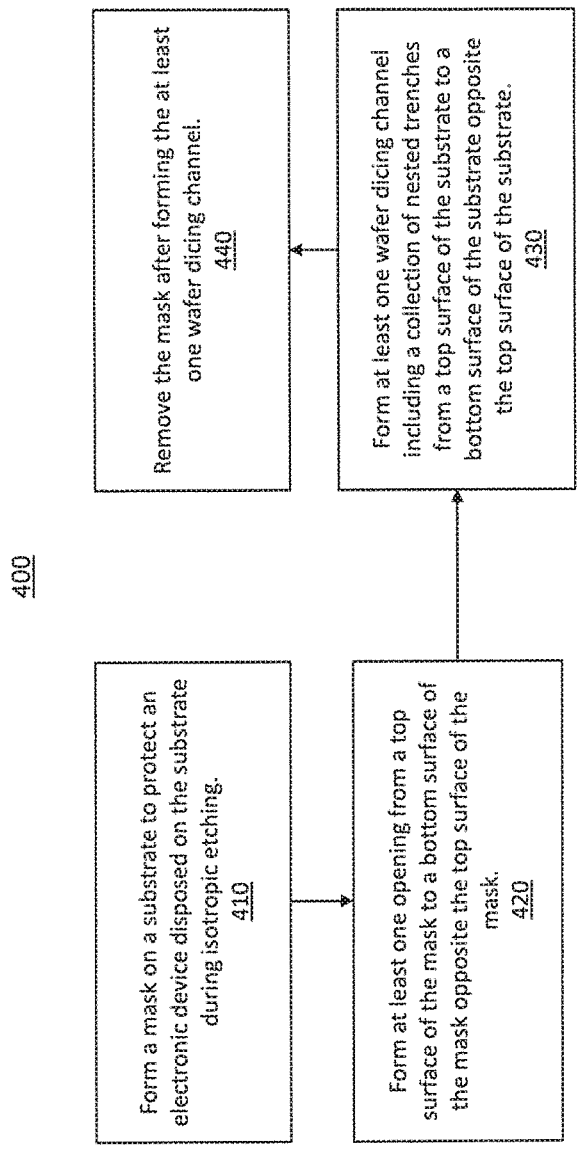
FIG. 11 is a block/flow diagram illustrating a system/method for fabricating caterpillar trenches for wafer dicing, in accordance with an embodiment of the present invention.

Referring to FIG. 11, a block/flow diagram is shown illustrating a system/method 400 for fabricating caterpillar trenches for efficient wafer dicing.

At block 410, a mask is formed on a substrate to protect an electronics device disposed on the substrate during isotropic etching. The electronics device can include, e.g., a circuit. For example, the electronics device can include, e.g., an integrated circuit.

In one embodiment, the mask has a thickness of, e.g., about 10 μm. However, in other embodiments, the mask can be thinner or thicker. The mask can be patterned using any suitable process(es) in accordance with the embodiment described herein (e.g., lithography). The mask can include any suitable material in accordance with the embodiments described herein. Examples of mask materials include, but are not limited to, $SiO_2$, a silicon nitride material (e.g., SiN), photosensitive organic film dielectric materials, etc.

At block 420, at least one opening is formed from a top surface of the mask to a bottom surface of the mask opposite the top surface of the mask. The at least one opening can have a width below, e.g., about 1 μm. More specifically, the width of the at least one opening can be, e.g., about 0.5 μm.

In one embodiment, the at least one opening is created using isotropic or non-directional etching. In contrast to anisotropic or directional etching, which can include etch processes that etch material in a single direction, isotropic etch processes can etch material in multiple directions. For example, isotropic etch processes can have the same or similar etch rates for all spatial directions (e.g., lateral and downward etching can take place at the same or similar rate). Isotropic etch processes can include wet isotropic etch processes and dry isotropic etch processes.

A wet isotropic etch process is an isotropic etch processes that removes material by using a solvent including one or more liquid chemicals or etchants that react with material subject to removal. For example, the etchants can oxidize the material, and the oxidized material can be removed (e.g., dissolved). The etch rate for a wet isotropic etch process can be determined based on the concentrations of the etchants in the solvent.

At block 430, at least one wafer dicing channel including a collection of nested trenches is formed from a top surface of the substrate to a bottom surface of the substrate opposite the top surface of the substrate.

Forming the at least one wafer dicing channel includes isotropically etching through the at least one opening. Isotropically etching through the at least one opening to form the at least one wafer dicing channel includes isotropically etching a collection of nested trenches from a top surface of the substrate to a bottom surface of the substrate opposite the top surface of the substrate. The collection of nested trenches can include any suitable number of trenches so that the at least one wafer dicing channel is formed to the bottom surface of the substrate.

The lateral etching of the isotropic etch process removes material of the substrate underneath the mask due to the solvent reacting underneath the mask, resulting in undercutting that creates a concave shaped void. It is to be appreciated that the amount of undercutting needs to be controlled to prevent damage to the electronics device.

Isotropically etching through the at least one opening to form the at least one wafer dicing channel can include isotropically etching each trench of the collection of nested trenches such that each trench has a respective width. In one embodiment, the trenches of the collection of nested trenches can be arranged in order of ascending widths. For example, in an illustrative example in which the collection of nested trenches includes four trenches, a first trench having a top surface corresponding to the top surface of the substrate can have a smaller width than a second trench located underneath the first trench, the second trench can have a smaller width than a third trench located underneath the second trench, and the third trench can have a smaller width than a fourth trench having a bottom surface corresponding to the bottom surface of the substrate.

It is to be understood and appreciated that the etch rate and/or etch chemistry used to form the collection of nested trenches can be controlled to achieve a suitable or desired wafer dicing channel shape or geometry. As described above with reference to FIGS. 1-8, isotropically etching the collection of nested trenches can include isotropically etching each trench of the collection of nested trenches to have a trapezoidal shaped cross-section. Such a shape or geometry of the corresponding wafer dicing channel can correspond to a device having a pyramidal-type shape (e.g., rectangular pyramidal shape), as described above with reference to FIG. 9.

In one embodiment, forming the at least one wafer dicing channel can further include forming a spacer along sidewalls of at least one of the trenches in the collection of nested trenches. For example, forming the spacer can include depositing dielectric material along the substrate within the at least one trench, and etching a lateral surface of the dielectric material corresponding to the at least one opening (e.g., using anisotropic etching). The spacer can be formed using any suitable material and process in accordance with the embodiments described herein. For example, the spacer can include a hafnium oxide material (e.g., $HfO_2$). The trench in the collection of nested trenches corresponding to the bottom surface of the substrate (e.g., the final trench of the collection of nested trenches) can lack a spacer.

At block 440, the mask is removed after creating the at least one wafer dicing channel. In one embodiment, removing the mask after creating the at least one wafer dicing channel includes stripping the mask. Any suitable technique can be used to remove the mask in accordance with the embodiments described herein.

The illustrative embodiments described above with reference to FIGS. 1-11 allow for the fabrication of caterpillar trenches that form optimized and low-cost dicing channels, thereby increasing efficiency of wafer dicing. The embodiments described herein can reduce the amount of space that the dicing channels consume on the wafer. For example, the embodiments described herein can use an isotropic etch process and multiple sidewalls, as opposed to an anisotropic etch process such as, e.g., RIE, to form optimized and lower cost dicing channels. The dicing channels formed in accordance with the embodiments described herein can have sub-1 µm widths, as opposed to conventional dicing channels which can have widths ranging from about 10 µm to 100 µm. Thus, the embodiments described herein can be used to make smaller electronic devices (e.g., computers) with die sizes of, e.g., about 100 µm×100 µm.

Having described preferred embodiments of a semiconductor device and a method of fabricating caterpillar trenches for efficient wafer dicing (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating caterpillar trenches for wafer dicing, comprising:
    forming at least one opening within a mask formed on a substrate to protect an electronics device disposed on the substrate during isotropic etching; and
    isotropically etching through the at least one opening to form at least one wafer dicing channel, including laterally etching a collection of nested trenches including trenches each having a non-rounded cross-section from a first surface of the substrate to a second surface of the substrate opposite the first surface.

2. The method of claim 1, wherein forming the at least one opening further includes forming the at least one opening using isotropic etching.

3. The method of claim 1, wherein isotropically etching through the at least one opening to form the at least one wafer dicing channel further includes isotropically etching each trench of the collection of nested trenches such that each trench has a respective width.

4. The method of claim 3, wherein the trenches of the collection of nested trenches are arranged in order of ascending widths.

5. The method of claim 1, further comprising forming a spacer along sidewalls of at least one of the trenches in the collection of nested trenches, including depositing dielectric material along the substrate within the at least one trench, and etching a lateral surface of the dielectric material corresponding to the at least one opening.

6. The method of claim 5, wherein a trench in the collection of nested trenches corresponding to the bottom surface of the substrate lacks a spacer.

7. The method of claim 1, wherein the trenches each have a quadrilateral-shaped cross-section.

8. The method of claim 1, wherein the material underneath the mask is laterally etched with controlled undercutting to protect the electronics device.

9. A method for fabricating caterpillar trenches for wafer dicing, comprising:
    forming a mask on a substrate to protect an electronics device disposed on the substrate during isotropic etching;

forming at least one opening within the mask;

isotropically etching through the at least one opening to form at least one wafer dicing channel, including laterally etching a collection of nested trenches including trenches each having a non-rounded cross-section from a first surface of the substrate to a second surface of the substrate opposite the first surface; and removing the mask after the at least one wafer dicing channel is formed.

10. The method of claim 9, wherein forming the at least one opening further includes forming the at least one opening using isotropic etching.

11. The method of claim 9, wherein isotropically etching through the at least one opening to form the at least one wafer dicing channel further includes isotropically etching each trench of the collection of nested trenches such that each trench has a respective width.

12. The method of claim 11, wherein the trenches of the collection of nested trenches are arranged in order of ascending widths.

13. The method of claim 9, further comprising forming a spacer along sidewalls of at least one of the trenches in the collection of nested trenches, including depositing dielectric material along the substrate within the at least one trench, and etching a lateral surface of the dielectric material corresponding to the at least one opening.

14. The method of claim 13, wherein a trench in the collection of nested trenches corresponding to the bottom surface of the substrate lacks a spacer.

15. The method of claim 9, wherein the trenches each have a quadrilateral-shaped cross-section.

16. The method of claim 9, wherein the material underneath the mask is laterally etched with controlled undercutting to protect the electronics device.

17. A semiconductor device including caterpillar trenches for wafer dicing, comprising:

a substrate;

at least one wafer dicing channel including a collection of nested trenches including trenches each having a trapezoidal cross-section from a top surface of the substrate to a bottom surface of the substrate opposite the top surface of the substrate.

18. The device of claim 17, wherein the trenches of the collection of nested trenches are arranged in order of ascending widths.

19. The device of claim 17, further comprising a spacer disposed along sidewalls of at least one of the trenches in the collection of nested trenches, wherein a trench in the collection of nested trenches corresponding to the bottom surface of the substrate lacks the spacer.

* * * * *